US009040313B2

(12) United States Patent
Hong

(10) Patent No.: US 9,040,313 B2
(45) Date of Patent: May 26, 2015

(54) METHOD OF MANUFACTURING ORGANIC LIGHT EMITTING DISPLAY DEVICE USING ORGANIC LAYER DEPOSITION APPARATUS

(71) Applicant: SAMSUNG DISPLAY CO., LTD., Yongin, Gyeonggi-Do (KR)

(72) Inventor: Jong-Won Hong, Gyeonggi-Do (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/196,469

(22) Filed: Mar. 4, 2014

(65) Prior Publication Data

US 2014/0370626 A1    Dec. 18, 2014

(30) Foreign Application Priority Data

Jun. 17, 2013  (KR) .......................... 10-2013-0069191

(51) Int. Cl.
*H01L 21/66* (2006.01)
*H01L 51/00* (2006.01)
*H01L 21/68* (2006.01)
*H01L 21/67* (2006.01)
*H01L 21/677* (2006.01)

(52) U.S. Cl.
CPC ............ *H01L 22/12* (2013.01); *H01L 51/0012* (2013.01); *H01L 21/68* (2013.01); *H01L 21/682* (2013.01); *H01L 21/67173* (2013.01); *H01L 21/67748* (2013.01); *H01L 21/6776* (2013.01)

(58) Field of Classification Search
CPC . H01L 21/68; H01L 21/682; H01L 21/67173; H01L 21/6776; H01L 21/67748; H01L 51/56; C23C 14/12; C23C 14/042; C23C 14/543

USPC ............................. 438/5, 14, 16, 99; 118/712
See application file for complete search history.

(56) References Cited

U.S. PATENT DOCUMENTS

| 5,537,311 | A | * | 7/1996 | Stevens ........................... 700/57 |
| 5,565,034 | A | * | 10/1996 | Nanbu et al. ................... 118/668 |
| 2010/0239746 | A1 | * | 9/2010 | Yamazaki et al. .............. 427/66 |
| 2013/0115764 | A1 | * | 5/2013 | Pederson et al. .............. 438/514 |

(Continued)

FOREIGN PATENT DOCUMENTS

| JP | 200628583 | 2/2006 |
| JP | 2010261081 | 11/2010 |

(Continued)

*Primary Examiner* — Michael Trinh
(74) *Attorney, Agent, or Firm* — F. Chau & Associates, LLC

(57) ABSTRACT

A method of manufacturing an organic light-emitting display device is provided. An alignment master member is loaded on a moving unit. An organic layer deposition assembly is pre-aligned to the alignment master member. After the pre-aligning of the organic layer deposition assembly, a substrate is loaded on the moving unit. The organic layer deposition assembly is aligned to the substrate positioned as is after the loading of the substrate. An organic layer is formed on the substrate while the moving unit is moving along the moving direction. While the moving unit is moving along the moving direction, the organic layer deposition assembly is adjusted so that an interval between the organic layer deposition assembly and part of the substrate is maintained as substantially constant. The part of the substrate receives a deposition material emitted from the organic layer deposition assembly to form the organic layer.

17 Claims, 11 Drawing Sheets

(56) References Cited

U.S. PATENT DOCUMENTS

2013/0199445 A1* 8/2013 Sonoda et al. ............... 118/712
2013/0309403 A1* 11/2013 Park et al. .................. 427/255.6

FOREIGN PATENT DOCUMENTS

| KR | 1020060123944 | 12/2006 |
| KR | 1020080036983 | 4/2008 |

* cited by examiner

METHOD OF MANUFACTURING ORGANIC LIGHT EMITTING DISPLAY DEVICE USING ORGANIC LAYER DEPOSITION APPARATUS

CROSS-REFERENCE APPLICATION

This application claims priority under 35 U.S.C. 119 to Korean Patent Application No. 10-2013-0069191, filed on Jun. 17, 2013 in the Korean Intellectual Property Office, the disclosure of which is incorporated by reference herein in its entirety.

TECHNICAL FIELD

The present invention relates to an organic layer deposition apparatus and a method of manufacturing an organic light emitting display device by using the organic layer deposition apparatus.

DISCUSSION OF RELATED ART

Organic light-emitting display devices have a larger viewing angle, better contrast characteristics, and a faster response speed than other display devices, and thus have drawn attention as a next-generation display device.

Organic light-emitting display devices include intermediate emissive layers disposed between a first electrode and a second electrode. Organic light-emitting display devices are formed on a substrate using a deposition mask.

SUMMARY

According to an exemplary embodiment of the present invention, a method of manufacturing an organic light-emitting display device is provided. An alignment master member is loaded on a moving unit. An organic layer deposition assembly is pre-aligned to the alignment master member positioned as is after the loading of the alignment master member using a first position information of the alignment master member. The moving unit moves in a moving direction over the organic layer deposition assembly and the alignment master member is unloaded after the pre-aligning of the organic layer deposition assembly to the alignment master. After the pre-aligning of the organic layer deposition assembly, a substrate is loaded on the moving unit. Before the moving unit on which the substrate is held moves over the deposition assembly along the moving direction, the organic layer deposition assembly is aligned to the substrate positioned as is after the loading of the substrate using a second position information of the substrate. An organic layer is formed on the substrate while the moving unit is moving along the moving direction. While the moving unit is moving along the moving direction, the organic layer deposition assembly is adjusted so that an interval between the organic layer deposition assembly and part of the substrate is maintained as substantially constant. The part of the substrate receives a deposition material emitted from the organic layer deposition assembly to form the organic layer.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
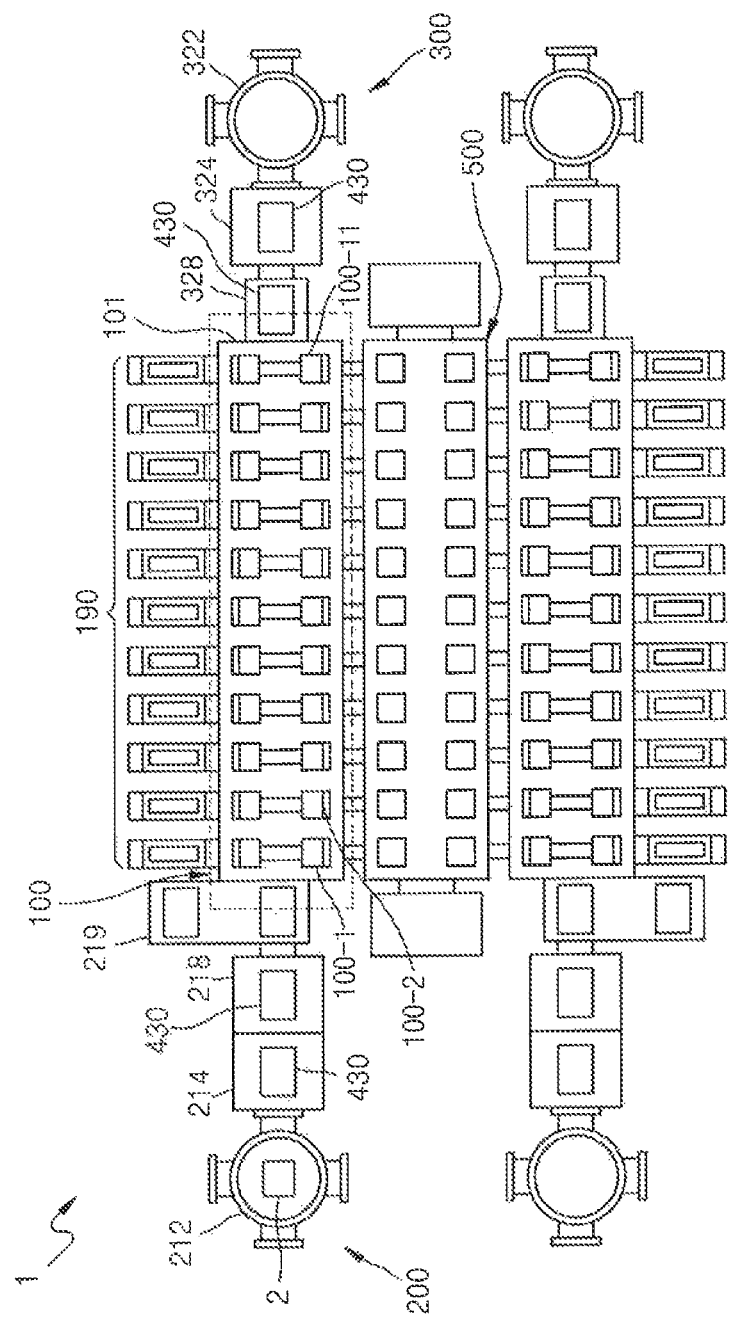
FIG. 1 is a plan view of an organic layer deposition apparatus according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when a layer is referred to as being "on" another layer or substrate, it may be directly on the other layer or substrate, or intervening layers may also be present. Like reference numerals may refer to the like elements throughout the specification and drawings. FIG. 1 is a plan view of an organic layer deposition apparatus according to an exemplary embodiment of the present invention, and FIG. 2 is a side view of a deposition unit of the organic layer deposition apparatus of FIG. 1, according to an exemplary embodiment of the present invention.

Figure 2:
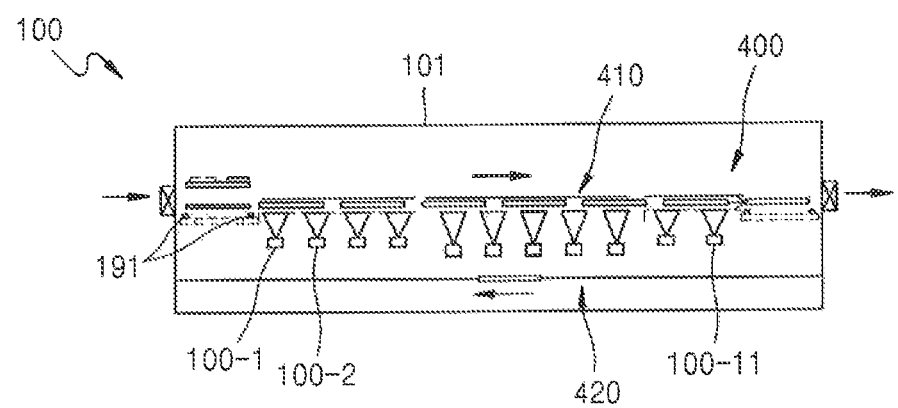
FIG. 2 is a side view of a deposition unit of the organic layer deposition apparatus of FIG. 1, according to an exemplary embodiment of the present invention.

Referring to FIGS. 1 and 2, an organic layer deposition apparatus 1 includes a reference measuring unit 191, the deposition unit 100, a loading unit 200, an unloading unit 300, and a conveyer unit 400.

The loading unit 200 includes a first rack 212, a transport chamber 214, a first inversion chamber 218, and a buffer chamber 219.

The first rack 212 holds a plurality of substrates 2 to be processed in the deposition unit 100. The transport chamber 214 includes a transport robot to pick up one of the substrates 2 from the first rack 212. The transport robot places the substrate on a moving unit 430. The moving unit 430 is transferred by a first conveyor unit 410 into the first inversion chamber 218.

The first inversion chamber 218 is disposed adjacent to the transport chamber 214. The first inversion chamber 218 includes a first inversion robot (not shown) that inverts the moving unit 430 and then loads it into a first conveyer unit 410 of the deposition unit 100.

Referring to FIG. 1, the transport robot of the transport chamber 214 places one of the substrates 2 on an upper surface of the moving unit 430, and the moving unit 430 is transferred into the first inversion chamber 218. The first inversion robot of the first inversion chamber 218 inverts the first inversion chamber 218 so that the substrate 2 is turned upside down in the deposition unit 100.

The unloading unit 300 is configured to operate in an opposite manner to the loading unit 200 as described above. For example, a second inversion robot of a second inversion chamber 328 inverts the moving unit 430 that has passed through the deposition unit 100. The substrate 2 is disposed on the moving unit 430. The moving unit 430 is transferred into an ejection chamber 324. Then, an ejection robot of the ejection chamber 324 ejects the substrate 2 and the moving unit 430 from the ejection chamber 324, separates the substrate 2 from the moving unit 430, and then loads the substrate 2 into a second rack 322. The moving unit 430, separated from the substrate 2, is returned to the loading unit 200 via the second conveyer unit 420.

The present invention is not limited to the above description. For example, when disposing the substrate 2 on the moving unit 430, the substrate 2 may be fixed onto a lower surface of the moving unit 430 and then moved into the deposition unit 100. In this case, for example, the first inversion robot of the first inversion chamber 218 and the second inversion robot of the second inversion chamber 328 need not be required.

The reference measuring unit 191 is disposed between the loading unit 200 and the deposition unit 100. For example, the reference measuring unit 191 is positioned at an entrance of the deposition unit 100. The reference measuring unit 191 serves to measure position information of the substrate 2 when the substrate 2 enters the deposition unit 100. The reference measuring unit 197 further serves to measure position information of an alignment master member 180 of FIG. 5 when the alignment master member 180 enters the deposition unit 100. For example, the reference measuring unit 191 measures a distance to the substrate 2. The reference measuring unit 191 further measures an angular displacement of the substrate 2 with respect to the direction in which the moving unit 430 is transferred. Using the position information of the substrate 2, the substrate 2 is aligned with organic layer deposition assemblies 100-1, 100-2, through to 100-11. This will be described later.

The deposition unit 100 includes at least one deposition chamber 101. For example, the deposition unit 100 includes a chamber 101 housing a plurality of organic layer deposition assemblies 100-1 to 100-11. The number of organic layer deposition assemblies is not limited to eleven (11), and it may be varied according to a deposition material and deposition conditions. The chamber 101 is maintained in a vacuum state during a deposition process.

The moving unit 430 on which the substrate 2 is placed travels through the loading unit 200, the deposition unit 100, and the unloading unit 300 using the first conveyor unit 410. The moving unit 430 returns from the unloading unit 300 to the loading unit 200 using the second conveyor unit 420. In the unloading unit 300, the substrate 2 is separated from the moving unit 430 and is loaded into the second rack 322.

The first conveyer unit 410 is configured to pass through the chamber 101 when passing through the deposition unit 100, and the second conveyer unit 420 is configured to convey the moving unit 430 from the unloading unit 300 to the loading unit 200.

In the organic layer deposition apparatus 1, the first conveyer unit 410 is disposed over the second conveyer unit 420. The first conveyer unit 410 and the second conveyer unit 420 move in an opposite direction to each other. For example, the first conveyer unit 410 moves in a first direction from the loading unit to the unloading unit thereby moving the moving unit 430 with a substrate along the first direction in the deposition unit 100. The second conveyer unit 420 moves in a second direction from the unloading unit to the loading unit thereby moving the moving unit 430 without the substrate along the second direction in the deposition unit 100. Accordingly, the moving unit 430 travels around the organic layer deposition apparatus 1 without increasing space for the moving unit 430 returning from the unloading unit 300 to the loading unit 200 thereby increasing space utilization efficiency.

The deposition unit 100 of FIG. 1 further includes a deposition source replacement unit 190 disposed at a side of each organic layer deposition assembly. The deposition source replacement unit 190 may be o a cassette-type structure. The deposition source replacement unit 190 is attached to the outside of each organic layer deposition assembly. Thus, a deposition source 110 of FIG. 3 of each organic layer deposition assembly is replaced at the outside of the deposition unit 100.

As shown in FIG. 1, two organic layer deposition apparatuses 1 are arranged in parallel. For example, the two organic layer deposition apparatuses 1 are arranged side-by-side so that a patterning slit sheet replacement unit 500 is disposed between the two organic layer deposition apparatuses 1. The two organic layer deposition apparatuses 1 share the patterning slit sheet replacement unit 500 thereby increasing space utilization efficiency.

Figure 3:
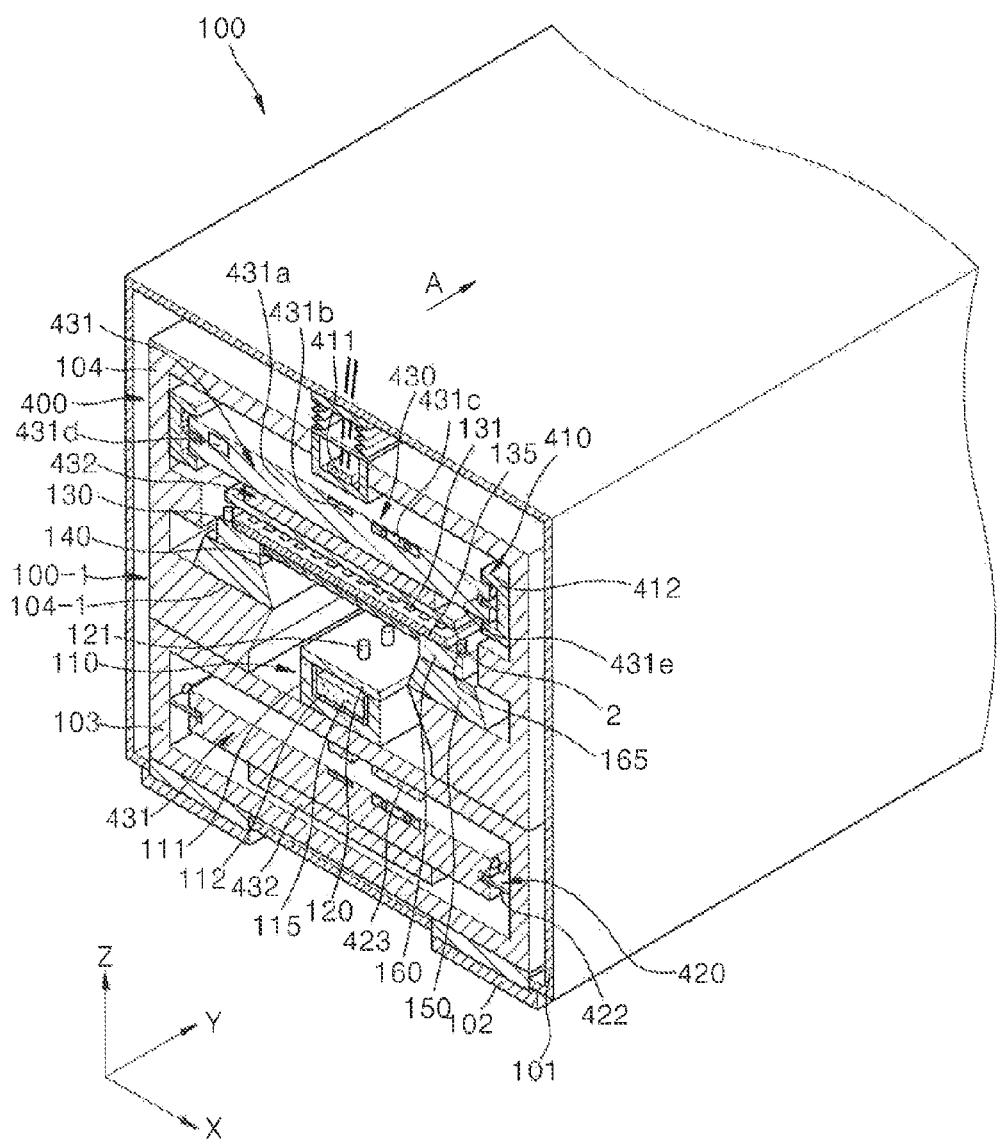
FIG. 3 is a perspective view of the deposition unit of FIG. 1, according to an exemplary embodiment of the present invention.
Figure 4:
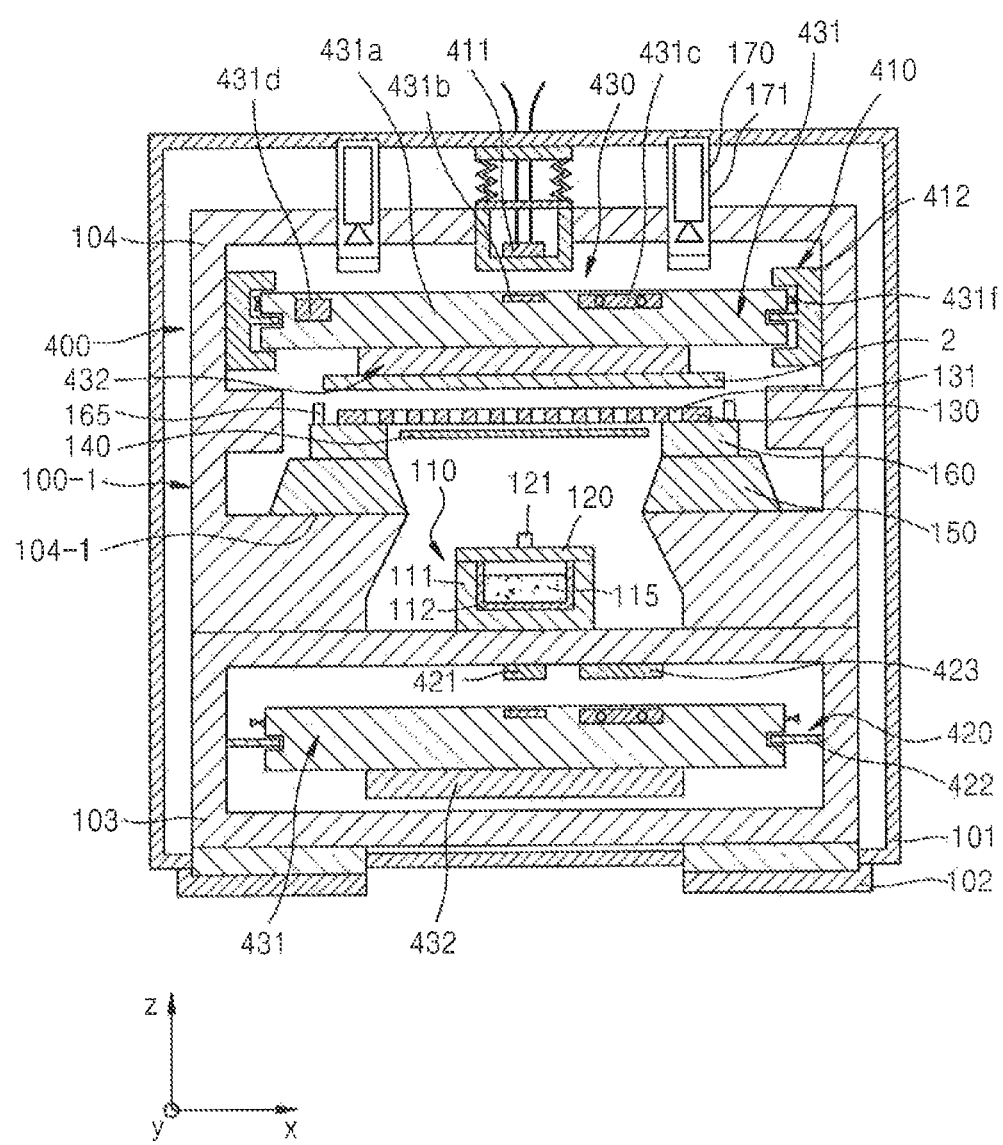
FIG. 4 is a sectional view of the deposition unit illustrated in FIG. 3, according to an exemplary embodiment of the present invention.

FIG. 3 is a perspective view of the deposition unit 100 of FIG. 1, according to an exemplary embodiment of the present invention, and FIG. 4 is a sectional view of the deposition unit 100 of FIG. 3, according to an exemplary embodiment of the present invention.

Referring to FIGS. 3 and 4, the deposition unit 100 of the organic layer deposition apparatus 1 includes at least one organic layer deposition assembly 100-1 and the conveyer unit 400. The chamber unit 101 of the deposition unit 100 houses the organic deposition assembly 100-1 and the conveyer unit 400.

Hereinafter, the deposition unit 100 will now be described in detail.

The chamber 101 has a hollow box type structure and accommodates the at least one organic layer deposition assembly 100-1 and the conveyer unit 400. The chamber 101 is fixed on the ground using a foot 102. For example, the foot is attached to a lower housing 103. The lower housing 103 is coupled to an upper housing 104. For example, the upper housing 104 is stacked on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are disposed on the foot 102 fixed on the ground, the lower housing 103 and the upper housing 104 are maintained in a fixed position even though the chamber 101 is repeatedly contracted and expanded. Thus, the lower housing 103 and the upper housing 104 serves as a reference frame in the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. While the moving unit 430 passes through the deposition unit 100 using the first conveyer unit 410 and the second conveyer unit 420, a deposition process is continuously performed.

Hereinafter, the organic layer deposition assembly 100-1 will now be described in detail.

Each organic layer deposition assembly 100-1 includes a deposition source 110, a deposition source nozzle unit 120, a patterning slit sheet 130, a shielding member 140, a first stage 150, a second stage 160, and the like. The deposition unit 100 is accommodated within the chamber 101 that is maintained at an appropriate degree of vacuum. The chamber 101 is maintained at an appropriate vacuum to allow a deposition material to move in a substantially straight line through the organic layer deposition apparatus 1.

For example, the chamber 101 is maintained in a high-vacuum state so that a deposition material 115 that is emitted from the deposition source 110 is discharged through the deposition source nozzle unit 120 and the patterning slit sheet 130 onto a substrate 2 in a desired pattern using the patterning slit sheet 130. The temperature of the patterning slit sheet 130 is held at a temperature lower than that of the deposition source 110 to minimize thermal expansion of the patterning slit sheet 130.

The substrate 2, on which the deposition material 115 is to be deposited, is disposed in the chamber 101. The substrate 2 includes a substrate for flat panel displays. The substrate 2 has a size of 40 inches or greater. The substrate may be a mother glass for manufacturing a plurality of flat panel displays. Other substrates may also be employed.

In the deposition process, the substrate 2 passes over the organic layer deposition assembly 100-1. The deposition process is continuously performed while the substrate 2 facing the organic layer deposition assembly 100-1 is moved in a Y-axis direction. Accordingly, the deposition process is performed in a scanning manner in a direction of arrow A of FIG. 3. Alternatively, the deposition process may be performed such that the organic layer deposition assembly 100-1 is moved in the Y-axis direction while the substrate 2 is held at a fixed position.

The patterning slit sheet 150 is smaller than the substrate 2. For example, when the substrate is scanned in the Y-axis direction, the patterning slit sheet 150 has a length along the Y-axis direction less than that of the substrate 2. A conventional FMM is configured to have substantially the same size as a substrate and thus, is difficult to scale up to a large substrate. As described above, the scanning deposition method uses the patterning slit sheet 130 smaller than the substrate 2, and thus the patterning slit sheet 130 is lightweight compared to the conventional FMM for manufacturing a large display. Using the patterning slit sheet 130, which is smaller than the conventional FMM used in a conventional deposition method, is more convenient in all processes, including etching and other subsequent processes, such as precise extension, welding, moving, and cleaning processes, compared to the conventional deposition method using the conventional FMM.

The organic layer deposition assembly 100-1 and the substrate 2 are spaced apart from each other in a predetermined distance. This will be described later in detail.

The deposition source 110 serves to provide the deposition material 115 to the substrate 2. For example, the deposition source 110 contains the deposition material 115, vaporizing the deposition material 115 by heating the deposition source 110. The vaporized the deposition material is deposited on the substrate 2. The deposition source 110 is disposed on the lower housing 103, facing the substrate 2.

The deposition source 110 includes a crucible 111 containing the deposition material 115, and a heater 112 heating the crucible 111 to vaporize the deposition material 115. The vaporized deposition material 115 is emitted through the deposition source nozzle unit 120 which covers the crucible 111.

The deposition source nozzle unit 120 covers an open end of the crucible 111, facing the substrate 2. The deposition source nozzle unit 120 may be differently arranged to form a common layer and a pattern layer.

The patterning slit sheet 130 is disposed between the deposition source 110 and the substrate 2. The patterning slit sheet 130 includes a frame 135 and a plurality of patterning slits 131. The frame 135 has a lattice shape similar to a window frame. Each patterning slit 131 is arranged in the X-axis direction.

The vaporized deposition material 115 emitted from the deposition source nozzle unit 120 moves towards the substrate 2 through the patterning slit sheet 130.

The patterning slit sheet 130 may be manufactured by an etching method. In this regard, the total number of patterning slits 131 may be greater than the total number of deposition source nozzles 121.

The patterning slit sheet 130 is disposed above the deposition source 110 at a distance from the deposition source 110. The patterning slit sheet 130 is spaced apart from the substrate 2 in a predetermined distance. The patterning slit sheet 130 need not be in close contact with the substrate 2. In the scanning deposition method using the patterning slit sheet 130, the vaporized deposition material 115 is deposited through the patterning slit sheet 130 having a narrow region compared to the substrate. The vaporized deposition material 115 that arrives at the substrate 2 has a substantially similar directionality. The directionality of the vaporized deposition material is increased as the distance between the substrate 2 and the deposition source nozzle unit 120 increases. This directionality allows the patterning slit sheet 130 to be spaced apart from the substrate in a predetermined distance.

As described above, a patterning slit sheet 130 that serves as a mask for a scanning deposition method is smaller than a substrate. Thus, the patterning slit sheet 130 is lightweight. The patterning slit sheet 130 spaced apart from the substrate 2 avoids being in close contact with the substrate thereby eliminating defects on the substrate due to such close contact. Furthermore, a manufacturing time is reduced by eliminating a process step for contacting the patterning slit sheet 130 on the substrate 2.

Arrangement of each component of the upper housing 104 will now be described in detail.

The upper housing 104 is disposed on the lower housing 103, providing an opening to expose part of the lower housing 103. The deposition source 110 and the deposition source nozzle unit 120 are disposed on the exposed part of the lower housing 103. The upper housing 104 has accommodation portions 104-1 defining the opening. The first stage 150, the second stage 160, and the patterning slit sheet 130 are sequentially formed on the accommodation portions 104-1 to form a space between the substrate 2 and the deposition source nozzle unit 120.

The first stage 150 is configured to be movable in the X-axis and Y-axis directions so that the first stage 150 aligns the patterning slit sheet 130 in the X-axis and Y-axis directions. The first stage 150 includes a plurality of actuators so that the first stage 150 is moved in the X-axis and Y-axis directions in the upper housing 104.

The second stage 160 is configured to be movable in the Z-axis direction so that the second stage 160 adjusts a distance between the patterning slit sheet 130 and the substrate 2 in the Z-axis direction. The second stage 160 includes a plurality of actuators so that the second stage 160 is moved in the Z-axis direction in the upper housing 104.

The patterning slit sheet 130 is disposed on the second stage 160. As such, the patterning slit sheet 130 is disposed on the first stage 150 and the second stage 160 so as to move in the X-axis, Y-axis, and Z-axis directions, and thus, the patterning slit sheet 130 is aligned to the substrate 2 using the first stage 150 and the second stage 160.

In addition, the upper housing 104, the first stage 150, and the second stage 160 guides a flow path of the deposition material 115 so that the deposition material 115 discharged through the deposition source nozzles 121 is not dispersed outside the flow path. The flow path of the deposition material 115 is defined by the upper housing 104, the first stage 150, and the second stage 160, and thus, the movements of the deposition material 115 in the X-axis and Y-axis directions are simultaneously guided.

The shielding member 140 is disposed between the patterning slit sheet 130 and the deposition source 110. In detail, an anode or cathode pattern for light-emitting diode is formed on an edge of the substrate, and thus the edge including the anode or cathode pattern formed thereon is used as a terminal for later product inspection or as a terminal during manufacturing of a product. An organic material formed on the edge of the substrate 2 prevents an anode or a cathode pattern from performing its function. Thus, the shielding member 140 serves to prevent an organic material from being deposited on the edge of the substrate 2.

For example, the shielding member 140 is disposed on the edge of the substrate 2. The shielding member 140 may include two adjacent plates, which may be extended perpendicular to the direction in which the substrate 2 moves.

When the substrate 2 does not pass over the organic layer deposition assembly 100-1, the shielding member 140 screens the deposition source 110 so that the deposition material 115 discharged from the deposition source 110 does not reach the patterning slit sheet 130. When the substrate 2 enters into the organic layer deposition assembly 100-1, a front part of the shielding member 140 which screens the deposition source 110 moves along with the movement of the substrate 2, and thus, the flow path of the deposition material 115 is opened and the deposition material 115 discharged from the deposition source 110 is deposited on the substrate 2 via the patterning slit sheet 130. Also, when the substrate 2 has passed through the organic layer deposition assembly 100-1, a rear part of the shielding member 140 moving along with the movement of the substrate 2 screens the deposition source 110 so that the flow path of the deposition material 115 is closed. Accordingly, the deposition material 115 discharged from the deposition source 110 does not reach the patterning slit sheet 130.

As described above, the non-film-forming region of the substrate 2 is screened by the shielding member 140, and thus, the deposition material 115 may be effectively prevented from being deposited on the non-film-forming region of the substrate 2, without using a separate structure.

The conveyer unit 400 will now be described in more detail. Referring to FIGS. 3 and 4, the conveyer unit 400 includes the first conveyer unit 410, the second conveyer unit 420, and the moving unit 430.

The first conveyer unit 410 conveys in an in-line manner the moving unit 430. The moving unit 430 includes a carrier 431 and an electrostatic chuck 432 attached thereto. The substrate 2 is held on the electrostatic chuck 432. An organic layer is formed on the substrate 2 by the organic layer deposition assembly 100-1.

The second conveyer unit 420 returns the moving unit 430 from the unloading unit 300 to the loading unit 200 after the scanning deposition process is completed. The second conveyer unit 420 includes a coil 421, roller guides 422, and a charging track 423.

The first conveyer unit 410 and the second conveyer unit 420 move the carrier 431 of the moving unit 430, and the electrostatic chuck 432 is combined on a surface of the carrier 431. The electrostatic chuck 432 holds the substrate 2.

The carrier 431 includes a main body part 431*a*, a linear motor system (LMS) magnet 431*b*, contactless power supply (CPS) modules 431*c*, a power supply unit 431*d*, and guide grooves 431*e*.

The main body part 431*a* constitutes a base part of the carrier 431. The main body part 431*a* may include a magnetic material such as iron. In this regard, due to a repulsive force between the main body part 431*a* of the carrier 431 and magnetically suspended bearings (not shown) included in the first conveyer unit 410, the carrier 431 is held spaced apart from guide members 412 of the first conveyer unit 410 in a predetermined distance.

The guide grooves 431*e* are formed at both sides of the main body part 431*a*. Each guide groove 431*e* accommodates a guide protrusion (not shown) of the guide member 412.

The magnetic rail 431*b* is extended along a center line of the main body part 431*a*. The magnetic rail 431*b* is combined with a coil 411 to form a linear motor. The linear motor conveys the carrier 431 in an arrow A direction.

The magnetic rail 431*b* is disposed between the CPS modules 431*c* and the power supply unit 431*d* in the main body part 431*a*. The power supply unit 431*d* includes a rechargeable battery that provides power to the electrostatic chuck 432 that holds the substrate 2 using an electrostatic force. The CPS modules 431*c* are wireless charging modules that charge the power supply unit 431*d*. For example, the charging track 423 of the second conveyer unit 420, which is described later, is connected to an inverter (not shown) that transfers the carrier 431 into the second conveyer unit 420. A magnetic field is formed between the charging track 423 and the CPS modules 431*c* to supply power to the CPS module 431*c*. The power supplied to the CPS modules 431*c* is used to charge the power supply unit 431*d*.

The electrostatic chuck 432 includes an electrode embedded in its main body formed of ceramic. The electrode is supplied with power. Such an electrostatic chuck fixes the substrate 2 on a surface of the main body using an electrostatic force generated from a high voltage applied to the electrode.

Next, an operation of the moving unit 430 will now be described in detail.

The magnetic rail 431*b* and the coil 411 form a linear motor. The linear motor has a small frictional coefficient, little position error, and a relatively high degree of position determination. As described above, the linear motor includes the coil 411 and the magnetic rail 431*b*. The magnetic rail 431b is line-shaped and is disposed in the carrier 431. The coil 411 is disposed over the magnetic rail 431b at a predetermined distance. The structure of the magnetic rail 431b and the coil 411 allows the carrier 431 to move in a liner manner. The coil 411 is exposed to an air atmosphere, and the carrier 431 in which the magnetic rail 431b is disposed is in the chamber 101 that is maintained in vacuum.

The organic layer deposition assembly 100-1 of the organic layer deposition apparatus 1 further includes a camera 170 for an aligning process. For example, the organic layer deposition assembly 100-1 aligns a first alignment mark formed on the patterning slit sheet 130 and a second alignment mark formed on the substrate 2 using the camera 170. The camera 170 is mounted such that its optical path to the frame 135 or the substrate 2 is not blocked during the scanning deposition process. The camera 170 may be mounted in a camera accommodation unit 171 in an atmospheric state.

Hereinafter, alignment between a substrate and an organic layer deposition apparatus according to an exemplary embodiment of the present invention will be described in detail.

Figure 5:
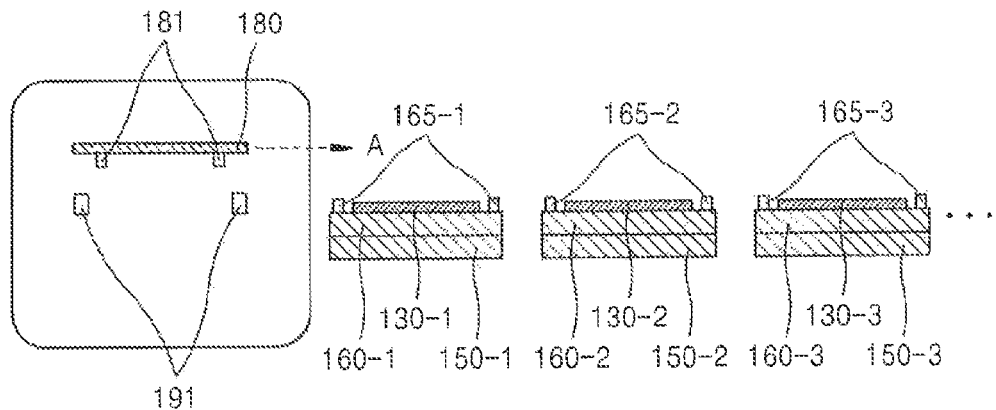
FIGS. 5 through 7 illustrate a process of aligning a substrate with a patterning slit sheet by using an alignment master member and a reference measuring unit, according to an exemplary embodiment of the present invention.
Figure 6:
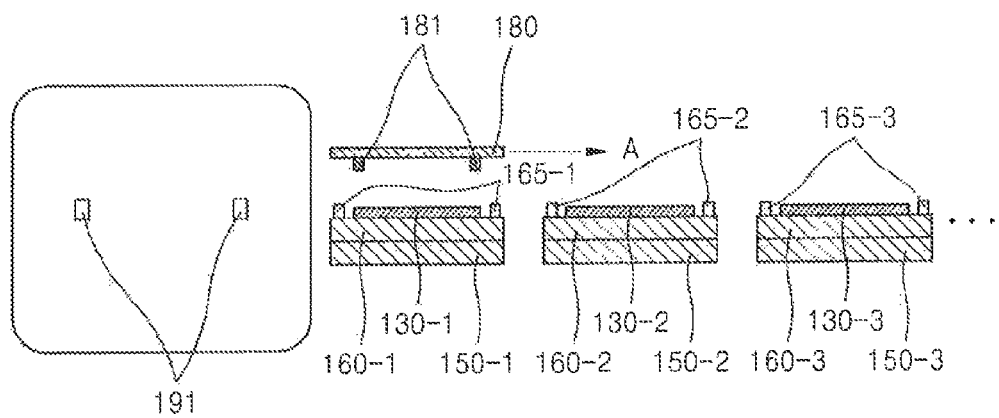
Figure 7:
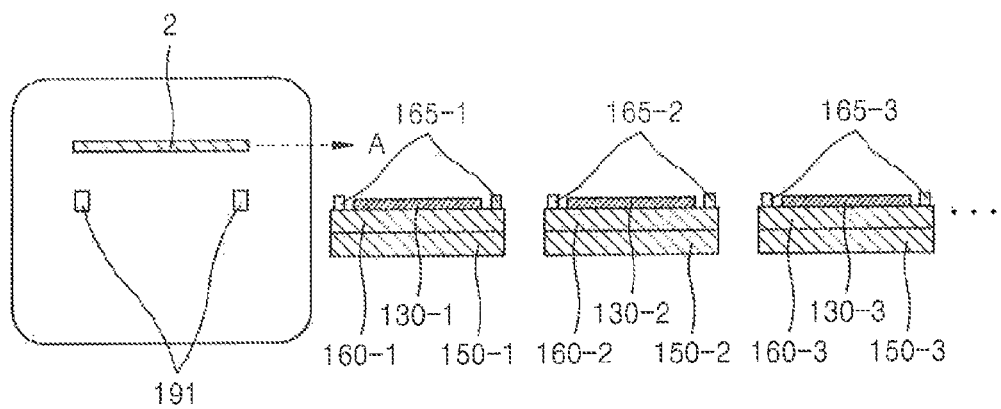

FIGS. 5 through 7 illustrates a process of aligning the substrate 2 with the patterning slit sheet 130 by using the alignment master member 180 and the reference measuring unit 191, according to an exemplary embodiment of the present invention. Referring to FIGS. 5 through 7, the organic layer deposition apparatus 1 further includes the alignment master member 180 for pre-alignment between the substrate 2 and the patterning slit sheet 130, and the reference measuring unit 191 (see FIG. 2) for measuring positions of the alignment master member 180 and the substrate 2.

The alignment master member 180 serves as a master substrate for performing a pre-alignment operation between the substrate 2 and the patterning slit sheet 130. The alignment master member 180 may independently move within the deposition unit 100 of the organic layer deposition apparatus 1 or may be moved by the moving unit 430 of FIG. 4 within the deposition unit 100. The alignment master member 180 moves in the direction that that the substrate 2 moves in the deposition unit 100.

An alignment master measuring unit 181 is disposed on the alignment master member 180. The alignment master measuring unit 181 measures a relative position of each patterning slit sheet 130-1, 130-2, 130-3, and so on from the alignment master member 180. The alignment master measuring unit 181 includes a gap sensor. The gap sensor is disposed on a bottom surface of the alignment master member 180 to measure a distance between each patterning slit sheet 130-1, 130-2, 130-3, and so on and the alignment master member 180. The alignment master measuring unit 181 may include at least three gap sensors, because a plane for measurement is defined by at least three points.

The reference measuring unit 191 is disposed between the loading unit 200 and the deposition unit 100 or at an entrance of the deposition unit 100. The reference measuring unit 191 serves to obtain position information of the substrate 2 or the alignment master member 180 before the substrate 2 or the alignment master member 180 enters the deposition unit 100. The position information of the substrate 2 or the alignment master member 180 includes a distance between the reference measuring unit 191 and either the substrate 2 or the alignment master member 180 and an angular displacement of the substrate 2 or the alignment master member 180 with respect to the direction that the moving unit 430 moves. The reference measuring unit 191 includes a gap sensor. The gap sensor is disposed below the substrate 2 or the alignment master member 180 to measure a distance from the gap sensor to the substrate 2 or the alignment master member 180. The reference measuring unit 191 may include at least three gap sensors, Each first stage 150-1, 150-2, 150-3, and so on and each second stage 160-1, 160-2, 160-3, and so on move their corresponding patterning slit sheet 130-1, 130-2, 130-3, and so on, stage measuring unit 165-1, 165-2, 165-3, and so on. The stage measuring units 165-1, 165-2, 165-3 serve to obtain position information of the substrate 2 that is moving. The position information of the substrate 2 includes a distance between each stage measuring unit 165-1, 165-2, 165-3, and so on and the substrate 2, and an angular displacement of the substrate with respect to the direction along which the moving unit 430 moves. The stage measuring units 165-1, 165-2, 165-3, and so on include gap sensors. Each gap sensor is disposed on each second stage 160-1, 160-2, 160-3, and so on to measure a distance from the gap sensor to the substrate 2. Each of the stage measuring units 165-1, 165-2, 165-3, and so on may include at least three gap sensors.

The position information of the alignment master member 180 obtained by the reference measuring unit 191, and the position information of the patterning slit sheets 130-1, 130-2, 130-3, and so on obtained by the alignment master measuring unit 181 are used to pre-align the patterning slit sheets 130-1, 130-2, 130-3, and so on. This will now be described in detail below.

Referring to FIG. 5, the alignment master member 180 is loaded into the deposition unit 100 before the substrate 2 is loaded thereinto, and the position information of the alignment master member 180 is obtained by the reference measuring unit 191. The position information of the alignment master member 180 includes a distance between the reference measuring unit 191 and the alignment master member 180 and an angular displacement of the alignment master member 180. The position information is used as a reference for all measurements of the substrate 2.

Referring to FIG. 6, the positions of the patterning slit sheets 130-1, 130-2, 130-3, and so on are adjusted using the position information of the alignment master member 180 obtained by the reference measuring unit 181. For example, the alignment master member 180 moves in the arrow A direction of FIG. 6 (i.e., a direction in which the substrate 2 is scanned) to measure distances to the patterning slit sheets 130-1, 130-2, 130-3, and so on of the organic layer deposition assemblies 100-1, 100-2, 100-3, and so on. Then, the first stages 150-1, 150-2, 150-3, and so on or the second stages 160-1, 160-2, 160-3, and so on are moved so that the positions of the patterning slit sheets 130-1, 130-2, 130-3, and so on are adjusted. At this time, positions of each of the patterning slit sheets 130-1, 130-2, 130-3, and so on in the X-axis, Y-axis, and Z-axis directions are adjusted such that the patterning slit sheets 130-1, 130-2, 130-3, and so on are disposed parallel to the alignment master member 180. Through this process, before the substrate 2 is inserted into the deposition unit 100 and subjected to deposition, the patterning slit sheet 130-1, 130-2, 130-3, and so on are pre-aligned.

Alignment of the patterning slit sheet 130-1, 130-2, 130-3, and so on, when deposition is actually performed on the substrate 2 inserted into the deposition unit 100, will now be described.

As illustrated in FIG. 7, before the substrate 2 is inserted into the deposition unit 100, the reference measuring unit 191 obtains position information of the substrate 2. The position information of the substrate 2 includes a distance between the reference measuring unit 191 and the substrate 2, and an angular displacement of the substrate 2. Using the position information of the alignment master member 180 and the position information of the substrate 2, the patterning slit sheets 130-1, 130-2, 130-3, and so on of the organic layer deposition assemblies 100-1, 100-2, 100-3, and so on are adjusted to be aligned to the substrate 2, and thus precise alignments between the substrate 2 and each of the patterning slit sheets 130-1, 130-2, 130-3, and so on are performed. The alignments include a tilt alignment operation, a shift alignment operation, a dynamic alignment operation, and a real-time alignment operation. The tilt alignment operation, the shift alignment operation, the dynamic alignment operation, and the real-time alignment operation will now be described in detail.

Figure 8:
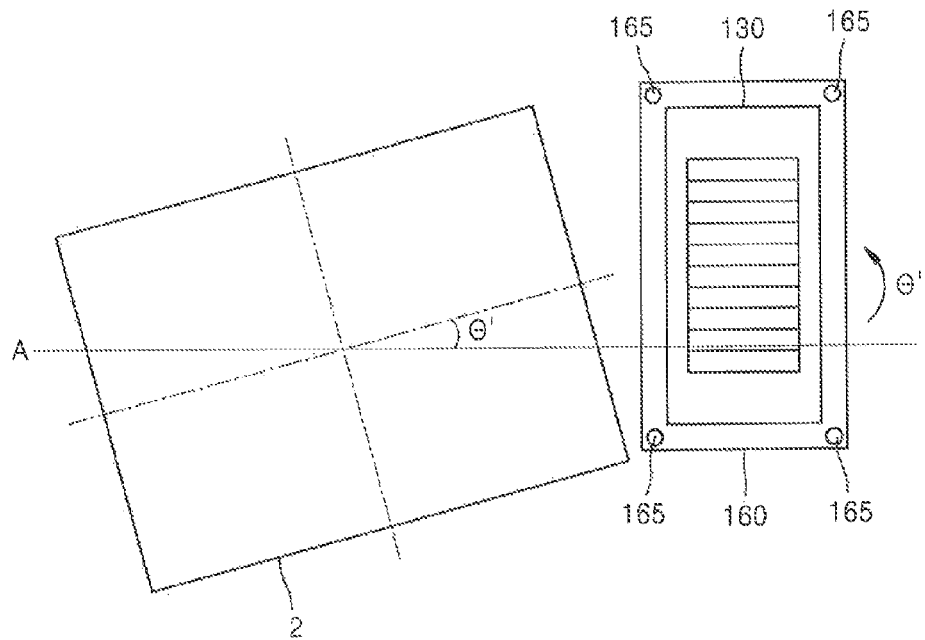
FIGS. 8 and 9 illustrate a process of performing tilt alignment between a substrate and a patterning slit sheet, according to an exemplary embodiment of the present invention.
Figure 9:
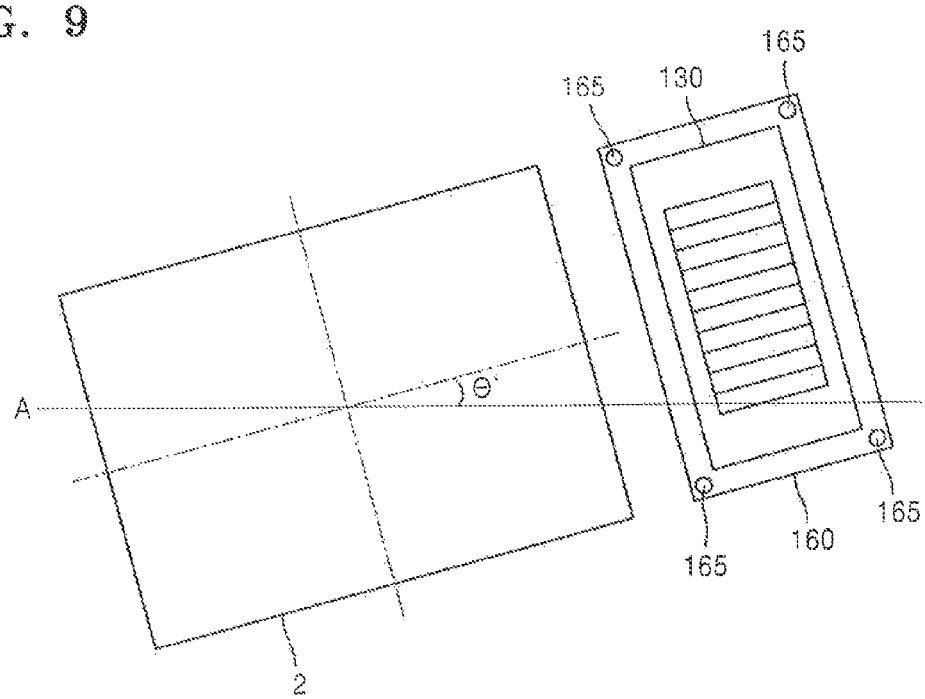

FIGS. 8 and 9 illustrates a process of performing a tilt alignment operation between the substrate 2 and the patterning slit sheet 130, according to an exemplary embodiment of the present invention.

As illustrated in FIG. 8, the substrate 2 is twisted by θ' with respect to a center line A when the substrate 2 is placed on the electrostatic chuck 432. The electrostatic chuck 432 is conveyed along a direction parallel to the center line A. The twisted angle θ' may have various values. Using the reference measuring unit 191, the twisted angle θ' is measured before the substrate 2 is inserted into the deposition unit 100. The twisted angle θ' is measured before the substrate 2 passes over the patterning slit sheet 130 in the deposition unit 100. The difference between the position information of the patterning slit sheet 130 and the position information of the substrate 2 is θ'.

As illustrated in FIG. 9, the patterning slit sheet 130 is rotated counterclockwise by the twisted angle of θ' (by which the substrate 2 is twisted) measured by the reference measuring unit 191. The rotation operation of the patterning slit sheet 130 is performed by the first stage 150 of FIG. 4.

Such a tilt alignment may be performed only once before the substrate 2 reaches the patterning slit sheet 130.

Figure 10:
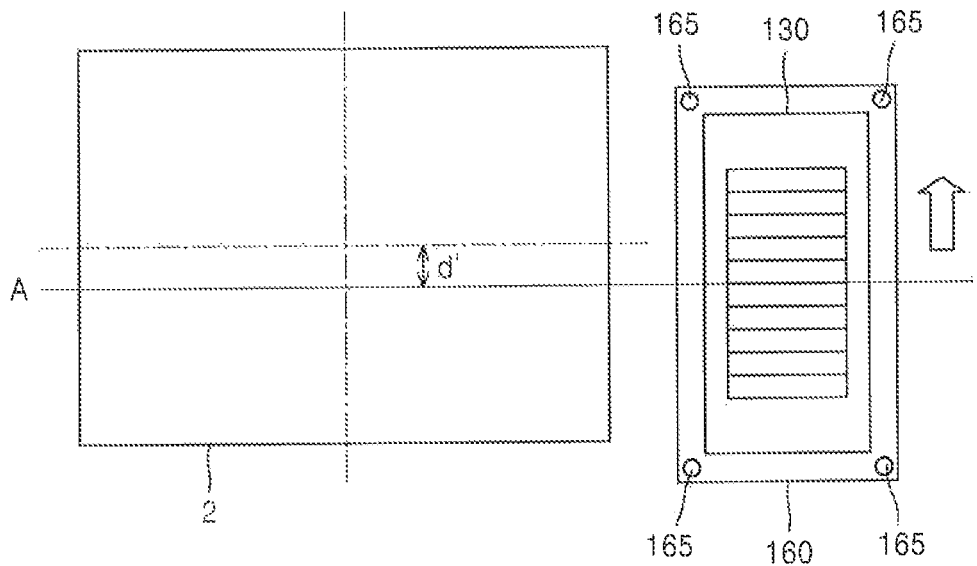
FIGS. 10 and 11 illustrate a process of performing shift alignment between a substrate and a patterning slit sheet, according to an exemplary embodiment of the present invention.
Figure 11:
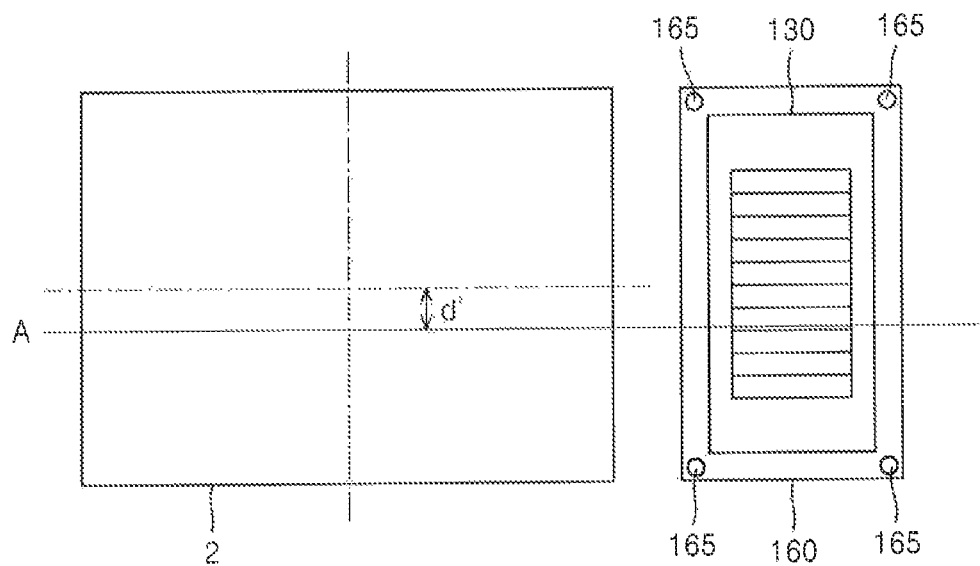

FIGS. 10 and 11 illustrates a process of performing a shift alignment operation between the substrate 2 and the patterning slit sheet 130, according to an exemplary embodiment of the present invention.

As illustrated in FIG. 10, the substrate 2 is shifted in parallel by a distance of d' with respect to the center line A when the substrate is placed on the electrostatic chuck 432. The electrostatic chuck 432 is conveyed along a direction parallel to the center line A. The reference measuring unit 191 measures the distance d' before the substrate 2 is inserted into the deposition unit 100. The displaced distance d' is measured before the substrate 2 passes over the patterning slit sheet 130 in the deposition unit 100. The difference between the position information of the patterning slit sheet 130 and the position information of the substrate 2 is d'.

As illustrated in FIG. 11, the patterning slit sheet 130 is shifted in parallel to the arrow direction by the distance of d' (by which the substrate 2 is moved in parallel) measured by the reference measuring unit 191. The shift operation is performed by the first stage 150 of FIG. 4.

Such a shift alignment may be performed only once before the substrate 2 reaches the patterning slit sheet 130.

Figure 12:
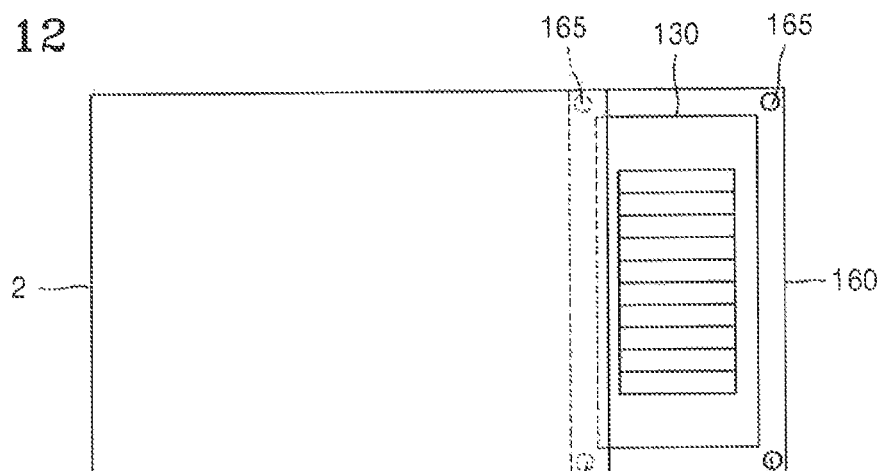
FIGS. 12 through 14 illustrate dynamic alignment and real-time alignment between a substrate and a patterning slit sheet, according to an exemplary embodiment of the present invention.
Figure 13:
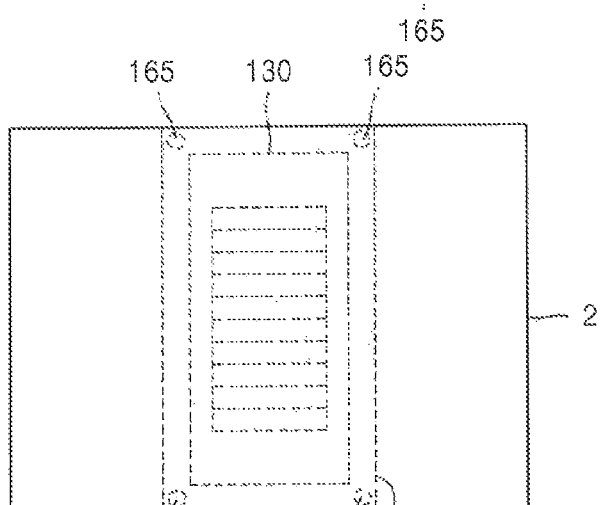
Figure 14:
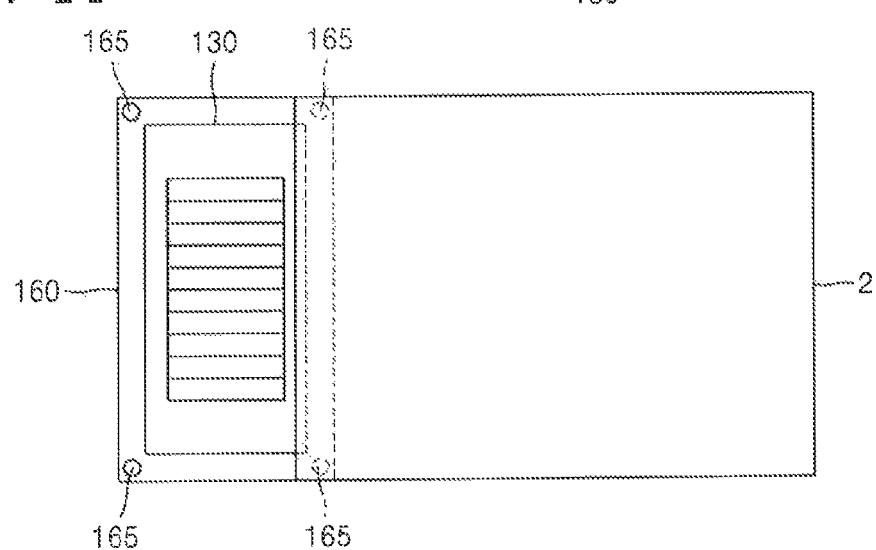

FIGS. 12 through 14 illustrate a dynamic alignment operation and a real-time alignment operation between the substrate 2 and the patterning slit sheet 130, according to an exemplary embodiment of the present invention.

The stage measuring unit 165 serves to continuously obtain position information of the substrate 2 with respect to the patterning slit sheet 130 while the substrate is moving over the patterning slit sheet 130 in the scanning deposition process. Using the position information of the substrate 2 relative to the patterning slit sheet 130, the patterning slit sheet 130 is adjusted in a Z-axis direction in real time so that a space between the patterning slit sheet 130 and the substrate 2 is maintained constant.

As illustrated in FIGS. 12 and 14, the stage measuring unit 165 detects the substrate 2 using at least one of the four gap sensors to perform a dynamic alignment operation. For example, when the substrate 2 starts to move over the patterning slit sheet 130, only two front gap sensors measure a first vertical distance between the substrate 2 and the patterning slit sheet 130 and the patterning slit sheet 130 is adjusted in the Z-axis direction using the first vertical distance to maintain the space constant in the scanning deposition method. When the substrate 2 starts to leave the pattering slit sheet 130, only two rear gap sensors measure a second vertical distance between the substrate 2 and the patterning slit sheet 130 and the patterning slit sheet 130 is adjusted in the Z-axis direction using the second vertical distance to maintain the space constant in the scanning deposition method.

As illustrated in FIG. 13, when the substrate 2 is sensed by the four gap sensors of the stage measuring unit 165, the second stage 160 of FIG. 4 moves vertically in the Z-axis direction or is tilt by a certain angle with respect to the Z axis so that the space between the patterning slit sheet 130 and the substrate 2 is maintained constant. For example, to move the patterning slit sheet 130 in the Z-direction, at least two actuators of the second stage 160 of FIG. 4 are driven in the same direction with respect to the Z-axis direction. To tilt the patterning slit sheet 130 with respect to the Z-axis direction, at least two actuators of the second stage 160 of FIG. 4 are driven in opposite directions with respect to the Z-axis direction.

Figure 15:
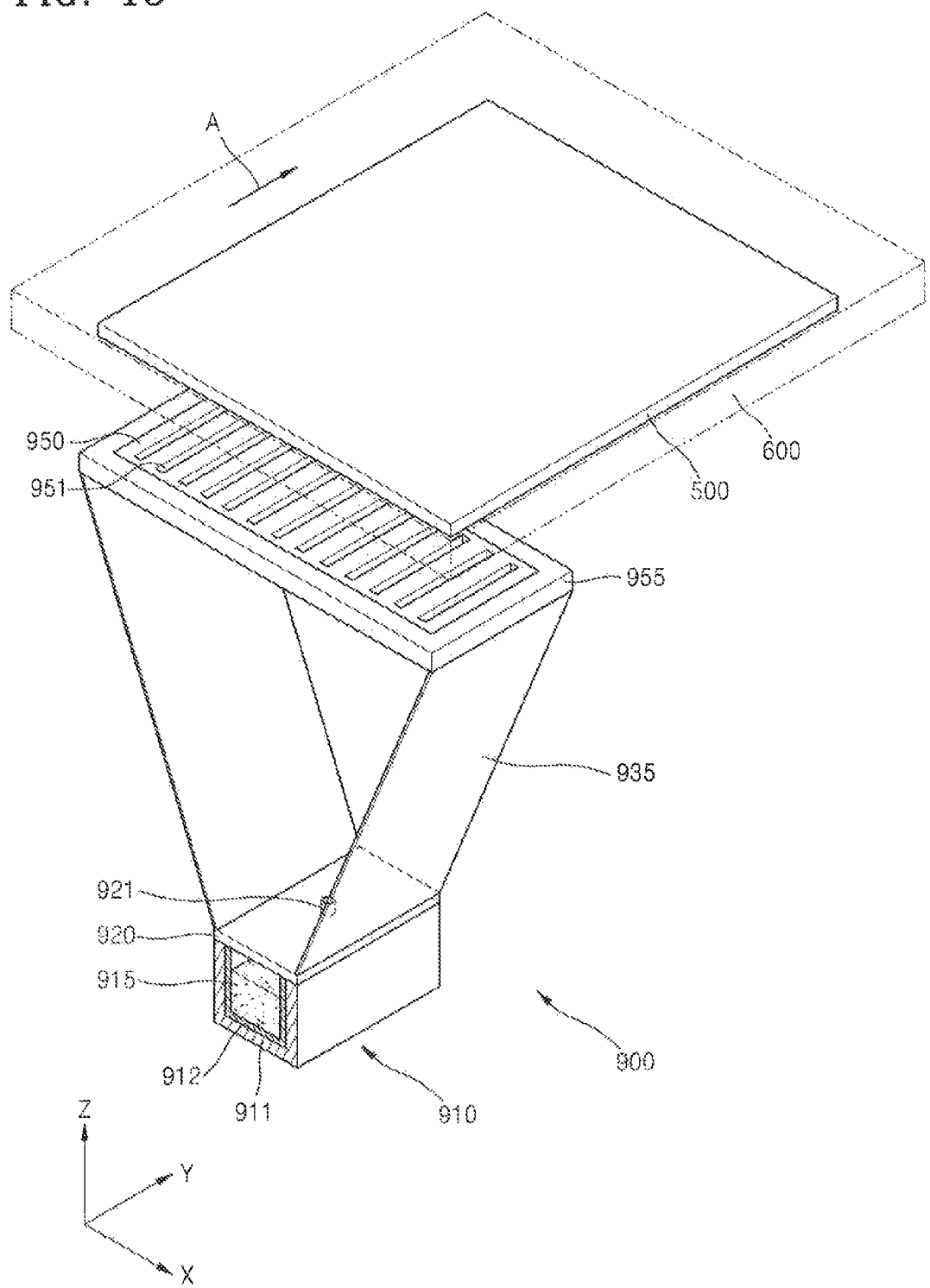
FIG. 15 is a perspective view of an organic layer deposition assembly according to an exemplary embodiment of the present invention.

FIG. 15 is a perspective view illustrating an organic layer deposition assembly 900 according to an exemplary embodiment of the present invention.

Referring to FIG. 15, the organic layer deposition assembly 900 includes a deposition source 910, a deposition source nozzle unit 920, and a patterning slit sheet 950.

The deposition source 910 includes a crucible 911 containing a deposition material 915, and a heater 912 heating the crucible 911 to vaporize the deposition material 915. The vaporized deposition material is emitted through the deposition source nozzle unit 920. The deposition source nozzle unit 920, which has a planar shape, is disposed such that the deposition source nozzle unit 920 covers an opening of the crucible 911. The deposition source nozzle unit 920 includes a deposition source nozzle 921. The deposition source nozzle unit 902 may be repeatedly arranged along the Y-axis direction. The patterning slit sheet 950 and a frame 955 are further disposed between the deposition source 910 and the substrate 2. The patterning slit sheet 950 includes a plurality of patterning slits 951 arranged along the X-axis direction. In addition, the deposition source 910 and the deposition source nozzle unit 920 are connected to the patterning slit sheet 950 using a connection member 935.

The arrangement of the deposition source nozzle 921 will be described in detail.

The deposition source nozzle unit 920 is disposed on the opening of the crucible 911 to close the crucible 911. The deposition source nozzle unit 920 includes the deposition source nozzle 921 that is directed towards the substrate 2. The vaporized deposition material 915 passes through the deposition source nozzle unit 920 and is emitted towards the substrate 2. The deposition source nozzle 921 is repeatedly arranged along the Y-axis direction. The substrate 2 moves along the Y-axis direction in the scanning deposition process. Accordingly, when the substrate moves along the Y-axis direction, the deposition source nozzle 921 is repeatedly arranged along the Y-axis direction and thus, distances between the deposition source nozzles 921 and a patterning slit 951 are substantially constant along the Y-axis direction. Accordingly, such arrangement of the deposition source nozzle 921 prevents a shadow region from being formed on the substrate 2 along the Y-direction. In addition, to prevent a shadow region along the X-axis direction on the substrate 2, only one deposition source nozzle 921 is disposed in the X-axis direction.

Figure 16:
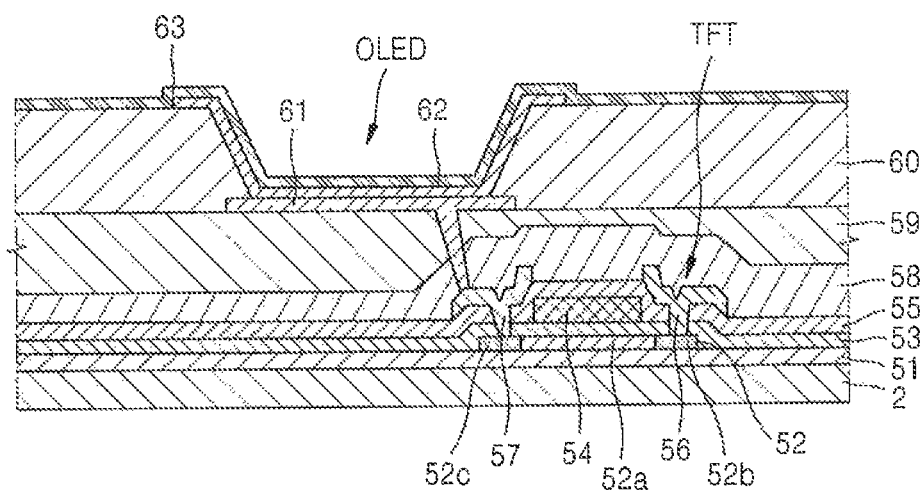
FIG. 16 is a cross-sectional view of an active matrix organic light-emitting display device fabricated by using an organic layer deposition apparatus, according to an exemplary embodiment of the present invention.

FIG. 16 is a cross-sectional view illustrating an active matrix organic light-emitting display device fabricated by using an organic layer deposition apparatus, according to an exemplary embodiment of the present invention.

Referring to FIG. 16, the active matrix organic light-emitting display device is formed on a substrate 2. The substrate 2 may be formed of a transparent material, for example, glass, plastic or metal. An insulating layer 51, such as a buffer layer, is formed on an entire surface of the substrate 2.

A thin film transistor TFT and an organic light-emitting diode OLED are disposed on the insulating layer 51.

A semiconductor active layer 52 is formed on an upper surface of the insulating layer 51 in a predetermined pattern. A gate insulating layer 53 is formed to cover the semiconductor active layer 52. The semiconductor active layer 52 may include a p-type or n-type semiconductor material.

A gate electrode 54 of the thin film transistor TFT is formed in a region of the gate insulating layer 53 corresponding to the semiconductor active layer 52. An interlayer insulating layer 55 is formed to cover the gate electrode 54. Thereafter, the interlayer insulating layer 55 and the gate insulating layer 53 are etched by etching, for example, dry etching, to form a contact hole exposing parts of the semiconductor active layer 52.

A source electrode 56 and a drain electrode 57 are formed on the interlayer insulating layer 55 to contact the semiconductor active layer 52 through the contact hole. A passivation layer 58 is formed to cover the source and drain electrodes 56 and 57, and is etched to expose a part of the drain electrode 57. An insulating layer 59 is formed on the passivation layer 58 to planarize the passivation layer 58.

In addition, the organic light-emitting diode OLED displays image information by emitting red, green, or blue light as current flows. The organic light-emitting diode OLED includes a first electrode 61 disposed on the passivation layer 58. The first electrode 61 is electrically connected to the drain electrode 57 of the thin film transistor TFT.

A pixel defining layer 60 is formed to cover the first electrode 61. An opening is formed in the pixel defining layer 60, and then an organic layer 62, including an emission layer, is formed in a region defined by the opening. A second electrode 63 is formed on the organic layer 62.

The pixel defining layer 60, which defines individual pixels, is formed of an organic material. The pixel defining layer 60 also planarizes the surface of a region of the substrate 30 in which the first electrode 61 is formed, and in particular, the surface of the passivation layer 59.

The first electrode 61 and the second electrode 63 are insulated from each other, and apply voltages of opposite polarities to the organic layer 62 to induce light emission.

The organic layer 62 including the emission layer may include a low-molecular weight organic material or a high-molecular weight organic material. When a low-molecular weight organic material is used, the organic layer 62 may have a single layer structure by including the emission layer or may have a multi-layered structure including a hole injection layer (HIL), a hole transport layer (HTL), an electron transport layer (ETL), or an electron injection layer (EIL), in addition to the emission layer. Exemplary organic materials may include, but are not limited to, copper phthalocyanine (CuPc), N,N'-di(naphthalene-1-yl)-N,N'-diphenyl-benzidine (NPB), or tris-8-hydroxyquinoline aluminum (Alq3).

The organic layer 62 including the emission layer is formed by using the organic layer deposition apparatus 1 of FIG. 1. For example, the organic layer deposition apparatus 1 of FIG. 1 vaporizes the deposition material and deposits the organic layer 62 on the substrate 2 of FIG. 1 that moves along a predetermined direction.

After the organic layer 62 is formed, the second electrode 63 may be formed by substantially the same deposition method as used to form the organic layer 62.

The first electrode 61 may function as an anode, and the second electrode 63 may function as a cathode. Alternatively, the first electrode 61 may function as a cathode, and the second electrode 63 may function as an anode. The first electrode 61 may be patterned to correspond to individual pixel regions, and the second electrode 63 may be formed to cover all the pixels.

The first electrode 61 may be formed of a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof. When the first electrode 61 includes both the transparent electrode and the reflective electrode, a transparent electrode layer of ITO, IZO, ZnO, or $In_2O_3$ is formed on the reflective layer. The first electrode 61 may be formed using a sputtering process and a patterning process such as a photolithography process.

The second electrode 63 may also be formed of a transparent electrode or a reflective electrode. When the second electrode 63 is formed of a transparent electrode, the second electrode 63 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on the organic layer 62. An auxiliary electrode layer or a bus electrode line is deposited on the metal having a low work function. The auxiliary electrode may be formed of ITO, IZO, ZnO, $In_2O_3$, or the like. When the second electrode 63 is formed of a reflective electrode, the reflective electrode may be formed by depositing Li, Ca, LiF/Ca, LiF/Al, Al, Ag, Mg, or a compound thereof on the organic layer 62. The second electrode 63 may be formed by using the same deposition method as used to form the organic layer 62 described above.

The organic layer deposition apparatus according to an exemplary embodiment of the present invention may be applied to form an organic layer or an inorganic layer of an organic TFT, and to form layers of various materials.

Hereinafter, a manufacturing process using an organic layer deposition apparatus according to an exemplary embodiment of the present invention will be described.

Figure 17:
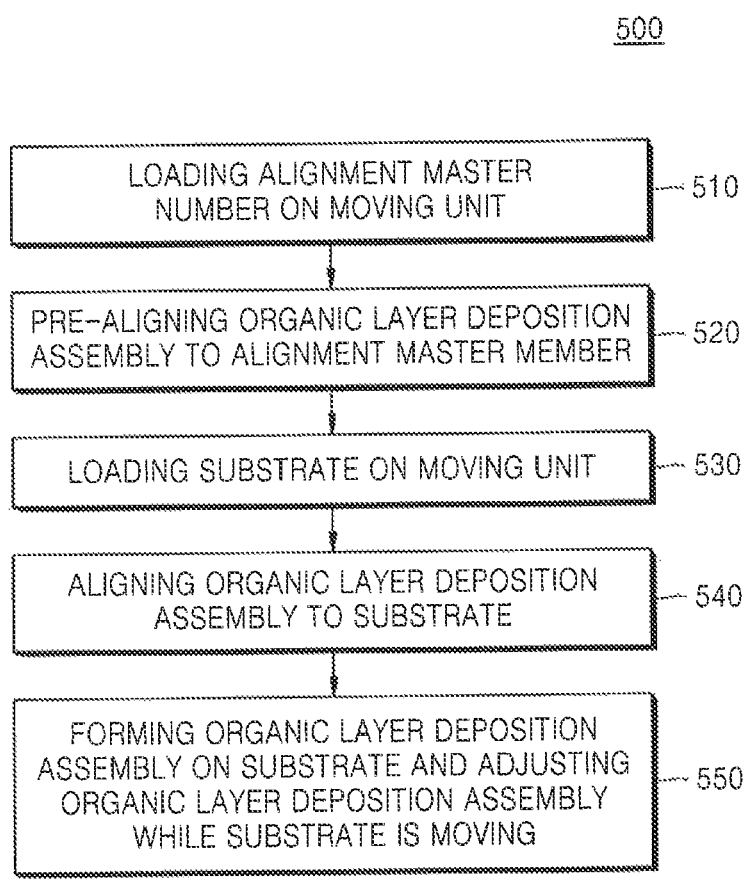
FIG. 17 is a flowchart illustrating a manufacturing process of an active matrix organic light-emitting display device using an organic layer deposition apparatus, according to an exemplary embodiment of the present invention.

FIG. 17 is a flowchart illustrating a manufacturing process of an active matrix organic light-emitting display device using an organic layer deposition apparatus, according to an exemplary embodiment of the present invention.

Referring to FIGS. 1, 5-7 and 17, in step 510, the alignment master member 180 is loaded on the moving unit 430. The alignment master member 180 serves as a master substrate for performing a pre-alignment operation on the organic layer deposition assemblies 100-1 to 100-11.

In step 520, the organic layer deposition assemblies 100-1 to 100-11 are aligned to the alignment master member 180. The alignment master member 180 is positioned as is after the loading of the alignment master member 180. Accordingly, the organic layer deposition assemblies 100-1 to 100-11 are adjusted using position information of the alignment master member 180 on the moving unit 430. In step 520, the moving unit 430 moves in a moving direction over the organic layer deposition assemblies 100-1 to 100-11, and the alignment master member 180 is unloaded from the moving unit 430 after the organic layer deposition assemblies 100-1 to 100-11 are pre-aligned to the alignment master member 180.

In step 530, the substrate 2 is loaded/held on the moving unit.

In step 540, the organic layer deposition assemblies 100-1 to 100-11 are aligned to the substrate 2, before the substrate is transferred over the deposition assemblies 100-1 to 100-11 along the moving direction. For example, the organic layer deposition assemblies 100-1 to 100-11 are aligned to the substrate 2 positioned as is after the loading of the substrate 2. Accordingly, the organic layer deposition assemblies 100-1 to 100-11 are adjusted using position information of the substrate 2 on the moving unit 430. Without rotating or shifting of the substrate 2, the positions of the organic layer deposition assemblies 100-1 to 100-11 are adjusted so that the organic layer deposition assemblies 100-1 to 100-11 are aligned to the substrate 2. Through steps 520 and 540 the organic layer deposition assemblies 100-1 to 100-11 are aligned to the substrate using the alignment master member 180.

In step 550, an organic layer is formed on the substrate 2 while the moving unit 430 is moving along the moving direction. While the moving unit 430 is moving along the moving direction, the organic layer deposition assemblies 100-1 to 100-11 are further adjusted so that an interval between each of the organic layer deposition assemblies 100-1 to 100-11 and part of the substrate 2 is maintained as substantially constant. The part of the substrate receives a deposition material emitted from the organic layer deposition assembly to form the organic layer.

As described above, according to exemplary embodiments of the present invention, an organic light-emitting display device may be manufactured using an organic layer deposition apparatus. The organic layer deposition apparatus may be precisely aligned to a substrate positioned as is after loaded, thereby facilitating manufacturing of large-sized display devices.

While the present invention has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of manufacturing an organic light-emitting display device, the method comprising:
   loading an alignment master member on a moving unit;
   pre-aligning an organic layer deposition assembly to the alignment master member positioned as is after the loading of the alignment master member, wherein the moving unit moves in a moving direction over the organic layer deposition assembly and the alignment master member is unloaded after the pre-aligning of the organic layer deposition assembly to the alignment master member;
   loading, after the pre-aligning of the organic layer deposition assembly, a substrate on the moving unit;
   before the moving unit on which the substrate is held moves over the deposition assembly along the moving direction, aligning the organic layer deposition assembly to the substrate positioned as is after the loading of the substrate; and
   forming an organic layer on the substrate while the moving unit is moving along the moving direction,
   wherein while the moving unit is moving along the moving direction, the organic layer deposition assembly is adjusted so that an interval between the organic layer deposition assembly and part of the substrate is maintained as substantially constant, wherein the part of the substrate receives a deposition material emitted from the organic layer deposition assembly to form the organic layer.

2. The method of claim 1, wherein the pre-aligning of the organic layer deposition assembly to the alignment master member is performed using a first position information of the alignment master member, and wherein the aligning of the organic layer deposition assembly to the substrate is performed using a second position information of the substrate.

3. The method of claim 2, wherein the first position information comprises, at least an angular displacement of the alignment master member with respect to the moving direction and a distance between a reference measuring unit and the alignment master member, wherein the second position information comprises at least an angular displacement of the substrate with respect to the moving direction and a distance between the reference measuring unit and the substrate, wherein the reference measuring unit is configured to measure the first and second position information.

4. The method of claim 3, wherein the pre-aligning of the organic layer deposition assembly to the alignment master member comprises:
   obtaining the first position information of the alignment master member using the reference measuring unit; and
   adjusting a position of a patterning slit sheet of the organic layer deposition assembly according to the first position information of the alignment master member, wherein the pattering slit sheet is configured to direct the deposition material toward the substrate moving along the moving direction.

5. The method of claim 4, wherein the reference measuring unit comprises at least three gap sensors configured to define a plane of the reference measuring unit or the substrate.

6. The method of claim 3, wherein the aligning of the patterning slit sheet comprises obtaining third position information of the patterning slit sheet relative to the alignment master member,
   wherein the aligning of the patterning slit sheet is performed using the third position information.

7. The method of claim 6, wherein the alignment master measuring unit comprises at least three gap sensors configured to define a plane of the patterning slit sheet.

8. The method of claim 4, wherein the aligning of the organic layer deposition assembly to the substrate comprises:
   obtaining the second position information of the substrate using the reference measuring unit; and
   adjusting the position of the patterning slit sheet of the organic layer deposition assembly by calculating a difference between the first position information and the second position information.

9. The method of claim 8, wherein the calculating of the difference between the first position information and the second position information comprises calculating a twisting variation between the angular displacement of the alignment master member and the angular displacement of the substrate.

10. The method of claim 9, wherein the patterning slit sheet is rotated according to the twisting variation.

11. The method of claim 8, wherein the first position information of the alignment master member further comprises a center position of the alignment master member, wherein the second position information of the substrate further comprises a center position of the substrate, wherein the calculating of the difference between the first position information and the second position information comprises calculating a shifting distance between the center position of the first position information and the center position of the second position information, wherein the shifting distance is calculated along a shifting direction substantially perpendicular to the moving direction.

12. The method of claim 11, wherein the patterning slit sheet is shifted to the substrate along the shifting direction according to the shifting distance.

13. The method of claim 8, wherein the organic layer deposition assembly further comprises:
 a first stage and a second stage configured to three-dimensionally move the patterning slit sheet; and
 a stage measuring unit configured to obtain fourth position information of the substrate relative to the first stage or the second stage.

14. The method of claim 13, wherein the stage measuring unit comprises at least four gap sensors configured to define a plane of the substrate moving along the moving direction.

15. The method of claim 14, wherein, if the substrate is being sensed by only two gap sensors, a height of the patterning slit sheet is controlled so that the interval between the part of the substrate and the patterning slit sheet is maintained as substantially constant.

16. The method of claim 14, wherein, if the substrate is being sensed by the four gap sensors, the height of the patterning slit sheet and tilting of the patterning slit sheet are controlled in real time so that the interval between the part of the substrate and the patterning slit sheet is maintained as substantially constant.

17. The method of claim 1, wherein the patterning slit sheet of the organic layer deposition assembly is smaller than the substrate in at least the moving direction.

* * * * *